United States Patent [19]

Myers

[11] 4,165,474
[45] Aug. 21, 1979

[54] OPTOELECTRONIC DISPLAYS USING UNIFORMLY SPACED ARRAYS OF SEMI-SPHERE LIGHT-EMITTING DIODES

[75] Inventor: David J. Myers, Plano, Tex.

[73] Assignee: Texas Instruments Incorporated, Dallas, Tex.

[21] Appl. No.: 865,037

[22] Filed: Dec. 27, 1977

[51] Int. Cl.² .................... H01L 33/00; H05B 33/02; H05B 33/20
[52] U.S. Cl. .................... 313/500; 313/512; 357/17
[58] Field of Search .................. 313/499, 500, 512; 357/17

[56] References Cited

U.S. PATENT DOCUMENTS

| | | | |
|---|---|---|---|
| 3,518,476 | 6/1970 | Winstel et al. | 313/499 |
| 3,593,070 | 7/1971 | Reed | 313/499 X |
| 3,719,849 | 3/1973 | Steward | 313/500 |
| 3,821,616 | 6/1974 | Kravitz | 313/500 X |
| 3,893,149 | 7/1975 | Grenon | 357/17 |
| 3,908,184 | 9/1975 | Anazawa et al. | 313/512 X |
| 3,950,844 | 4/1976 | Wisbey | 357/17 X |
| 3,954,534 | 5/1976 | Scifres et al. | 313/500 X |

OTHER PUBLICATIONS

"Light Emitting Diodes, etc.", by A. R. Peaker et al., Micro Electronics, vol. 7, No. 3, 1976.

Primary Examiner—Palmer C. Demeo
Attorney, Agent, or Firm—Melvin Sharp; Richard L. Donaldson; William E. Hiller

[57] ABSTRACT

Light-emitting p-n junction diode elements in the form of ion implanted spheres are mounted to a surface of an insulating substrate member. Metallic coatings are provided on both the semiconductor material and the implanted region for electrical contact. A transparent conductor material is then further disposed over the diode structure connecting diodes and forming an array.

17 Claims, 15 Drawing Figures

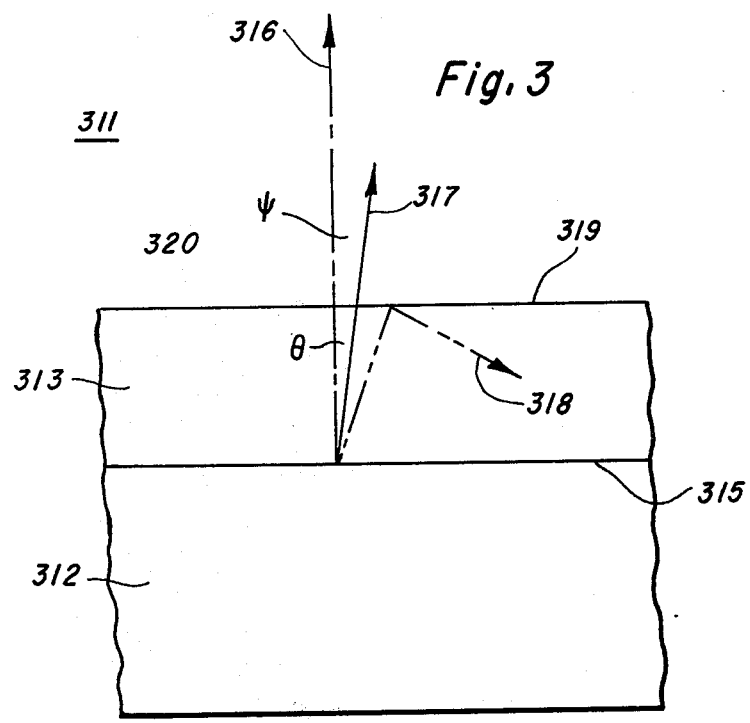
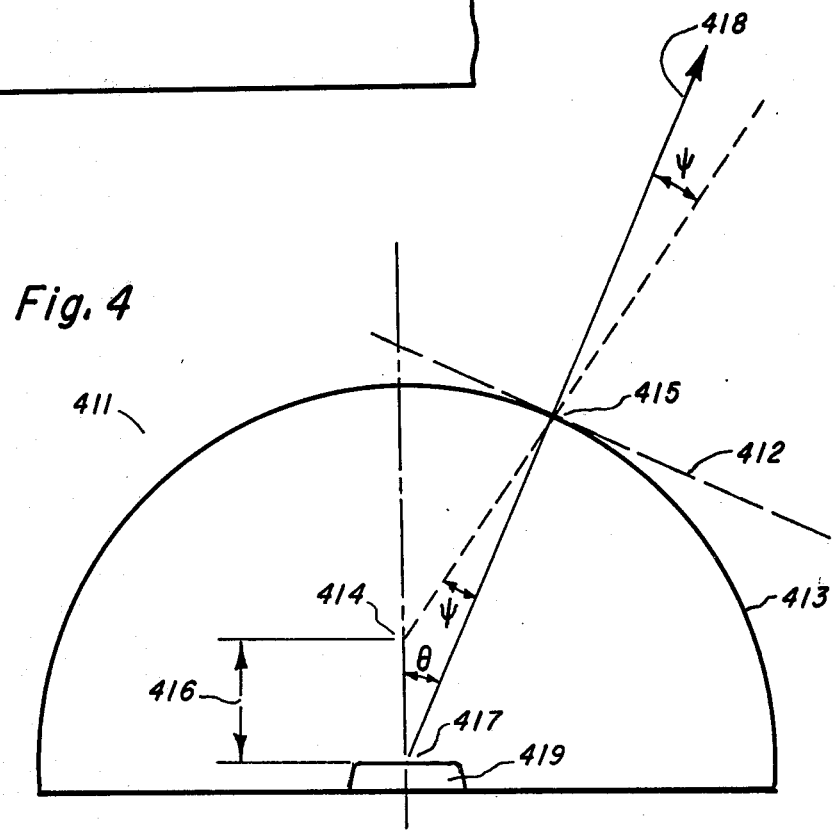

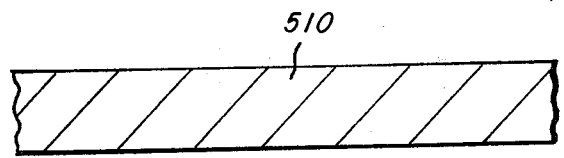
Fig. 5a
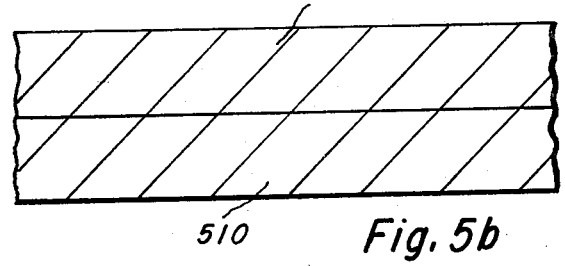
Fig. 5b
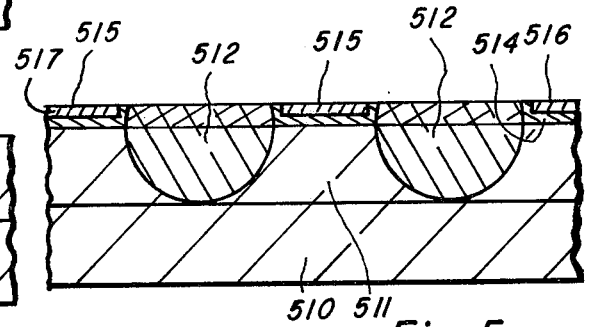
Fig. 5e
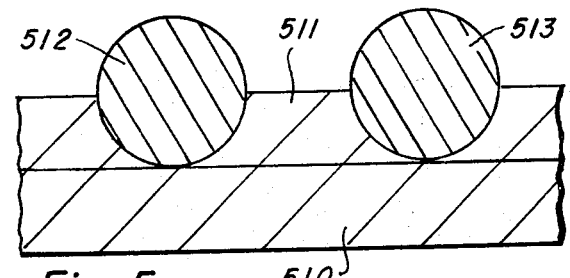
Fig. 5c
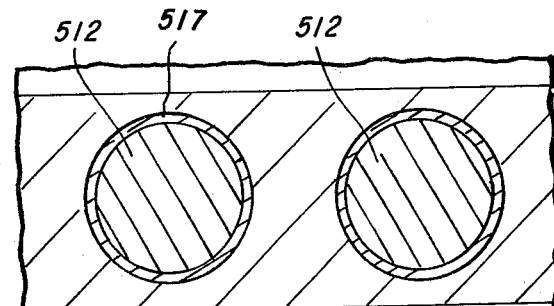
Fig. 5f
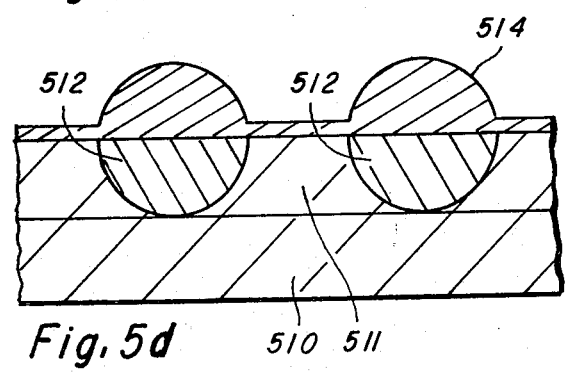
Fig. 5d
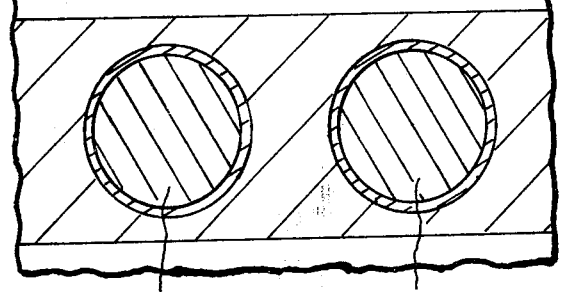
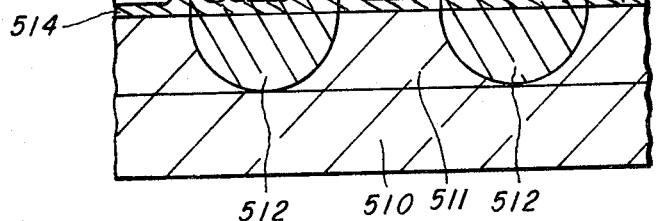
Fig. 5g

OPTOELECTRONIC DISPLAYS USING UNIFORMLY SPACED ARRAYS OF SEMI-SPHERE LIGHT-EMITTING DIODES

This invention relates to alphanumeric, character, or seven segment displays and more particularly to a regular array of semi-spherical light emitting diodes having an ion implanted region embedded in an insulating matrix to form a display.

BACKGROUND OF THE INVENTION

It has long been known that forward biased p-n junctions in certain compound semiconductor materials will emit light. Semiconductor p-n junction diodes have been arranged in arrays to provide alphanumeric character displays. Such arrays as previously produced were relatively expensive since they involved producing the diode junction structure on a large slice of material which was thereafter cut or broken into a large number of individual diodes, thus electrically isolating them from each other, and then reassembling the diodes into arrays for arrangements to provide the characters desired. Finally, individual wire connections had to be accomplished to at least one electrode of each diode. Further, planar processing is complicated, and the resulting planar geometry is not optimum for emitting light because of internal reflection. Element nonuniformity, misalignment and bad connections cause a high percentage of rework or rejection in conventional light emitting diodes (LEDs). This fact, coupled with the labor intensive nature of the process involved as well as its inherently high rated material waste, made LED displays relatively expensive to produce, and difficult to fabricate large displays having good resolution (a high number of lighted points per unit area).

Other displays as liquid crystal and electrochromic require ambient light, and are likely to have lifetime problems and be temperature sensitive. Electroluminescent displays require high voltage as do plasma displays.

To overcome the weaknesses of the conventional LED display a light emitting diode taking the form of a sphere or spheroid has been used. In U.S. application Ser. No. 752,389 entitled "Light Emitting Diode Element in Character Display" by G. F. Wakefield a spherical light emitting element having a multilayer sphere forming a subsurface p-n junction inserted into an insulation member is disclosed.

In pending application TI-6782, Ser. No. 834,630, filed Sept. 19, 1977, entitled "Optoelectronic Displays Using Uniformly Spaced Arrays of Semi-Sphere Light-Emitting Diodes and Method of Fabricating Same" by the inventor of the present invention and assigned to the assignee of the present invention, diode elements in the form of semi-spheres having an outer layer of semiconductor material of one conductivity type and a subsurface layer of semiconductor material of an opposite conductivity type are mounted to a surface of insulating substrate member extended therefrom to allow a portion of each diode element to protrude past the outer surface of the substrate.

SUMMARY OF THE INVENTION

The present invention further overcomes the weaknesses of the conventional light emitting diode displays by providing an array of individual ion implanted light emitting diodes having a body of compound semiconductor material of a first conductivity. By ion implanting or diffusing a dopant into a section of said semiconductor material a section having a second conductivity is provided. The compound semiconductor material is shaped to form a semispherical diode having a p-n junction at the juncture of the ion implanted section and the semiconductor material having a first conductivity type. A metal layer is annularly disposed over the semisphere of the compound semiconductor material forming an ohmic contact and further providing for x address lines for use of the diode element in a random access display. Insulation material is provided over the resulting structure, and further etched to form a window allowing for a second metal strip to be deposited contacting the diffused section of said semiconductor material and providing a second ohmic contact and y address line for a random access display.

A translucent material may also be illuminated by a plurality of diodes providing a light bar to allow for a more uniform light source from the diode elements. Further by instituting into the viscous glass material a substance, as for example air, bleeding from the diode due to some indirect reflection will mix with bleeding from an adjacent diode to allow for a consistent light intensity from a plurality of diodes set in a hexagonal array.

BRIEF DESCRIPTION OF THE DRAWINGS

FIG. 3 illustrates the loss of emitted light from a planar structure due to internal reflection;

FIG. 4 illustrates the loss of emitted light by a semispherical structure;

FIGS. 5a–5i are cross-sectional views that illustrate a process by which an array of ion implanted semispherical light emitting diodes is fabricated;

DETAILED DESCRIPTION OF THE DRAWINGS

Figure 1:
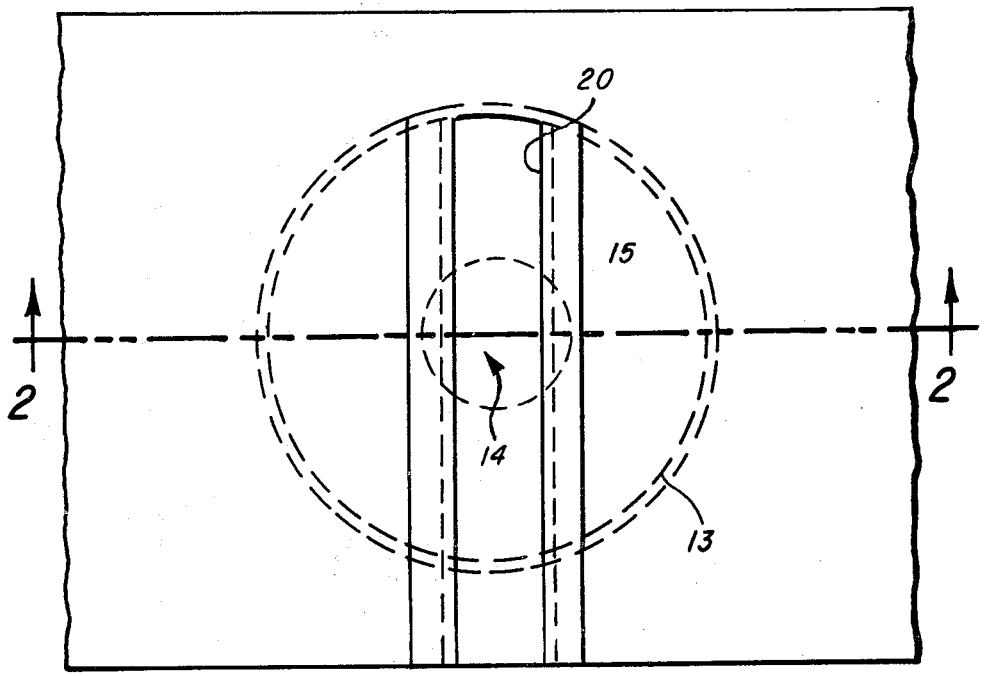
FIG. 1 is a plan view of a diode element illustrating the structure of a semispherical light emitting diode of the present invention.
Figure 2:
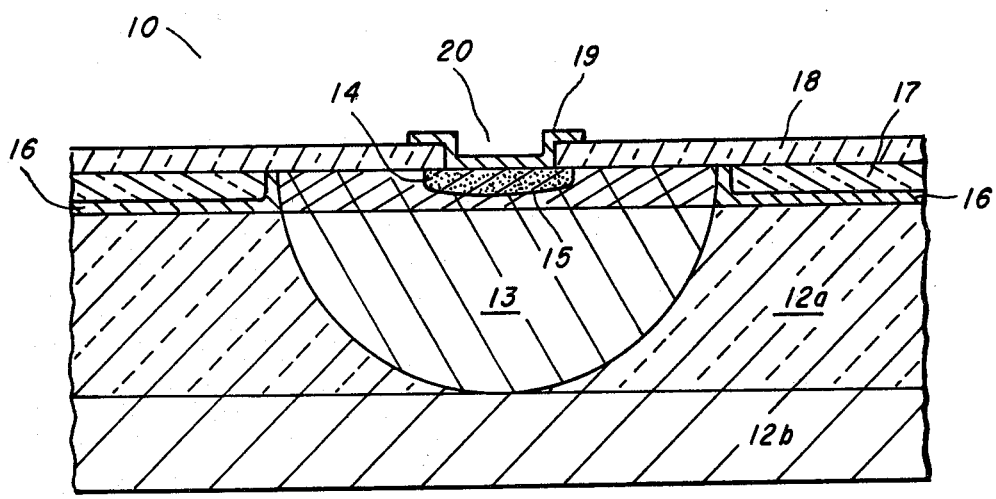
FIG. 2 is a cross-sectional view of the FIG. 1 illustrating in more detail the structural elements of a semispherical light emitting diode of the present invention.

Referring to the drawings and more particularly to FIGS. 1 and 2, an array 10 having a plurality of light emitting diodes is depicted of which one light emitting diode 11 is shown in two views. A semispherical structure 13 comprised of a Group III-V compound semiconductor material such as gallium arsencide for example is disposed with a substrate comprising a glass film 12a further supported by an insulating support member 12b. A metal strip 16 is annularly disposed on said semiconductor sphere 13 forming an ohmic contact to the semiconductor material 13 having a first conductivity type. Semiconductor material 13 may be ion implanted, diffused or epitaxially treated to form a section having a second conductivity material. An ion implanted section 14 is located in the center of said semispherical structure 13, whereby said section has a second conductivity type. The juncture of the first conductivity material 13 and the ion implanted section 14 forms a p-n junction 15.

A glass layer 17 serves as a filler and as a support for the junction protection material 18, which also may be a glass insulator. Further, a metal layer is disposed upon said diffused section through the insulation layer of junction protection glass 18 that has been etched so as to have a window 20. The second layer of metal 19 deposited via window 20 forms an ohmic contact to the ion implanted section having a second conductivity type.

FIGS. 3 and 4 demonstrate the advantage in the semispherical structure shown in FIGS. 1 and 2. As is well known, a planar light emitting diode 311 in FIG. 3 loses a considerable amount of light due to internal reflection. Light emitted at the p-n junction 312 at an angle $\theta$ will emerge at an angle $\psi$ which is equal to $\theta$ because the emission surface and the emergent surface ara parallel. The light ray 316 is emitted normal to the surface ($\psi = 0°$) and is generally unattenuated. However, as $\psi$ becomes larger, as with the light ray 417, the light is attenuated due to the difference to refraction index between the semiconductor 313 in the medium which it exists, 320. When the angle $\psi$ exceeds a critical angle, it is totally reflected from the surface 319 as shown by light ray 318 and no light is emitted.

Now considering the semispherical geometry of FIGS. 1 and 2 further illustrated in FIG. 4 such as light emitting diode 411 in FIG. 4, the emergent angle $\psi$ is not the same as the emission angle $\theta$. Instead, the angle $\psi$ is formed at a plane 412 tangent to the spherical surface 413. The angle $\psi$ can be formed by extending a line from the center of the sphere 414 to the point of emergence 415. The angle $\psi$ depends on the radius of the sphere, the initial angle $\theta$, and the distance 416 at which the emission point 417 is from the sphere center 414. A light ray 418 emitted from the p-n junction 419 at the point 417 will emerge from the surface 413 at an angle $\psi$. It is convenient to consider the distance 416 as a fraction z of the sphere radius. Using single geometry and trionometry the relationship that results in sine $\psi = z$ sine $\theta$, indicating that light can be emitted from a much larger angle $\theta$ before the emergent angle $\psi$ exceeds the critical value and the light is totally reflected.

Figure 5H:
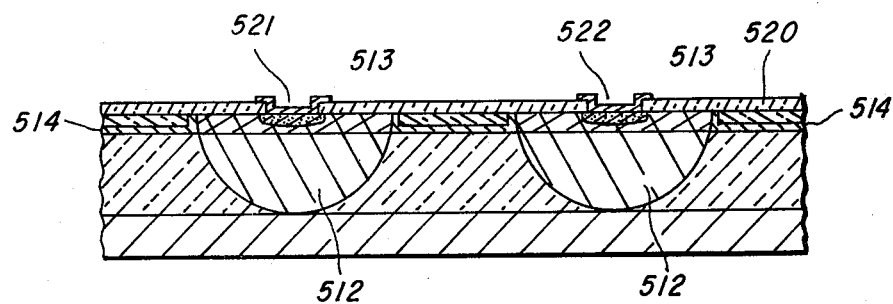

Referring now to FIGS. 5a–5i, and more particularly to FIG. 5a which depicts the first step in a process by which an ion implanted structure such as that shown in FIGS. 1 and 2 may be fabricated. In FIG. 5a a viscous glass slurry is cast into a film 510. This undercast film 510 is optional as it serves only to add strength to the resulting sheet. FIG. 5b illustrates a film 510 that has been partially dried and a second film 511 cast over it. The first film, 510 must be dry enough to support the weight of spheres which are introduced into the less dense film 511 as shown in FIG. 5c. The spheres 512 may be of a p-type gallium arsenide material and deposited into the glass film 511 from a vacuum plate for example. The sheet is then air dried, baked in an oven, and fired in a furnace. FIG. 5d illustrates ohmic contact strips 514 deposited over the spheres by evaporating through a shadow mask. Each exposed portion of a sphere is completely covered with metal, with the metal strips continuing to the edge of the sheets, where they will be accessable as drive or address lines in a random access display described hereinafter.

FIG. 5e demonstrates a glass filler 515 spread over the spheres which are then fired in a furnace. If necessary, a lap stop bump 516 is placed on the metal 514 prior to reglassing. The entire sheet is then lapped or cut producing semispherical structures 512 which are nearly, but not exactly, hemispheres. The metal strips form a ring 517 around each sphere further illustrated in a plan view of FIG. 5f.

FIG. 5g illustrates the use of a shadow mask 519 for ion implanting for example n-type gallium arsenide area 518 into the substantially semispherical structures 512 for purposes of forming a p-n junction 513.

Figure 5I:
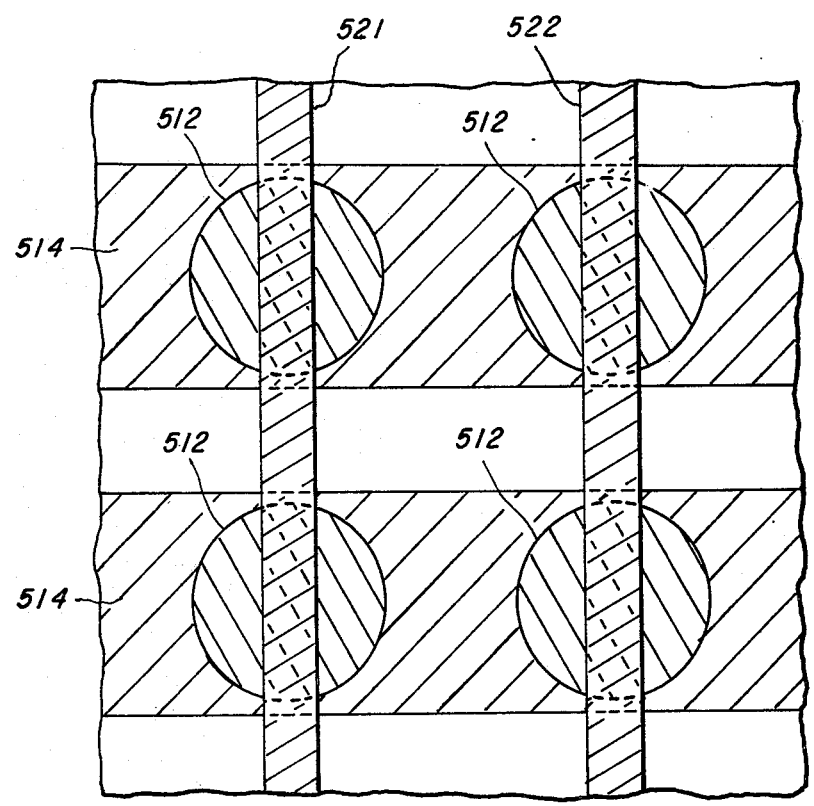

A second glass 520 is then deposited over the resulting structure dried and fired as shown in FIG. 5h. Contact holes 521 are etched through the glass by standard photomasking techniques. Finally, a second layer of metal stripping 522 is deposited by evaporation through a shadow mask, for providing ohmic contacts also extending to a second edge of the sheet to form a second set of address lines. FIG. 5i further illustrates the use of metal contacts as address lines in a random access type of display.

Figure 6:
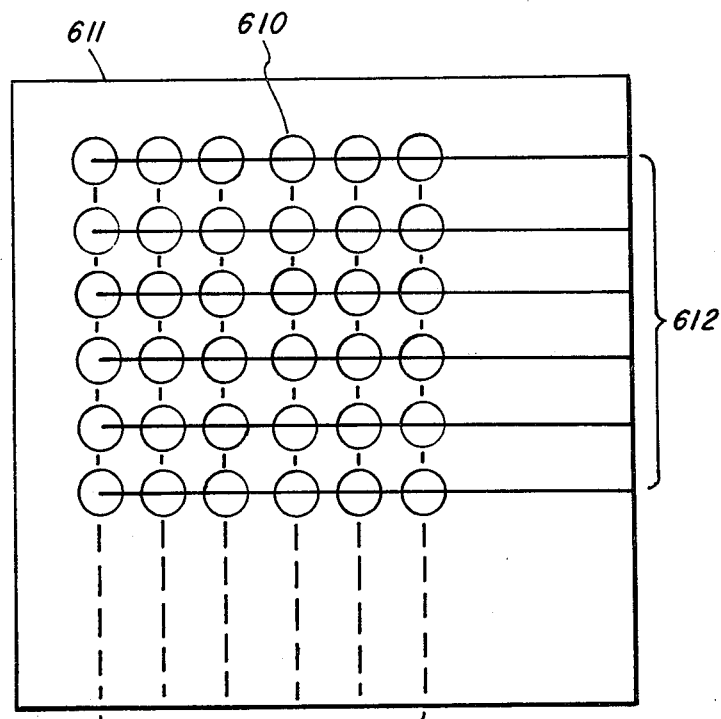
FIG. 6 illustrates a matrix-addressable (random access) display using light emitting diodes of the present invention.

FIG. 6 shows a matrix of light emiting diode semispheres as the light emitting diodes described above in relation to FIGS. 1–5. A plurality of light emitting diode semispheres 610 formed a matrix-addressable random access display 611. The x and y address lines are provided by the sets of metal strips 612 and 613 used for ohmic contacts to the diode element.

Figure 7:
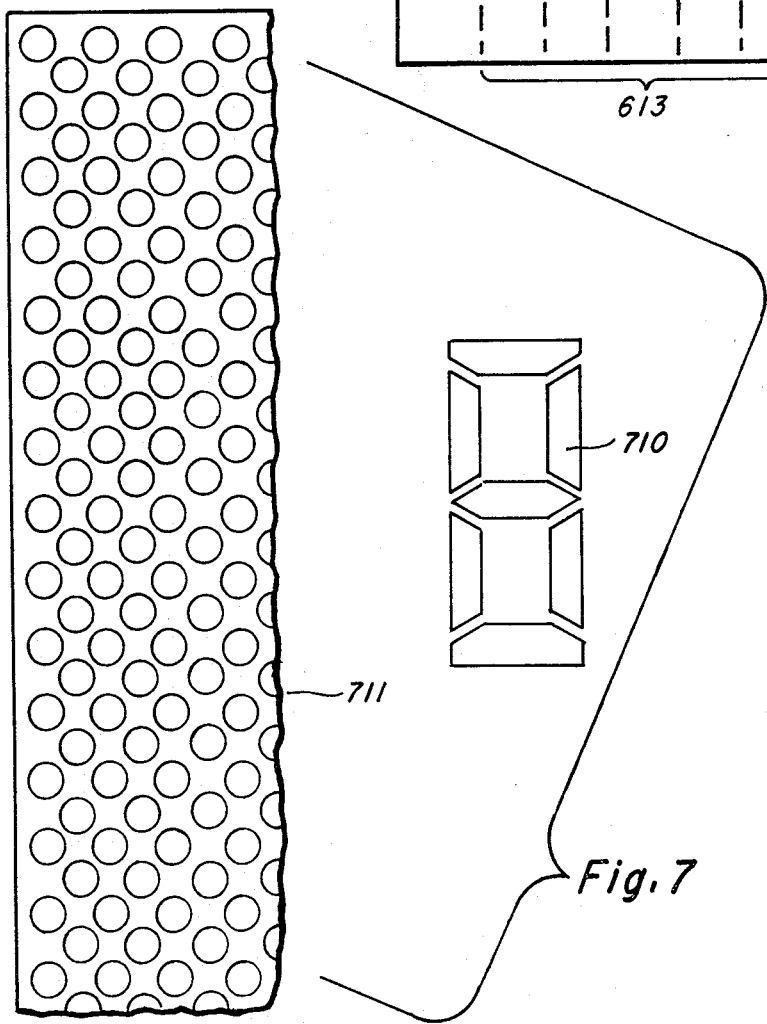
FIG. 7 illustrates a display segment having a plurality of diodes.

The present invention also includes several aspects pertaining to the glass matrix. The inclusion of selected substances in the glass slurry can result in a glass matrix which is opaque and/or colored. To minimize "bleeding" of light from a light emitting diode into adjacent areas of the glass, the matrix should preferrably be opaque. In some cases, however, it may be desirable for the light to spread out over large areas of the sheet. In such cases, a translucent glass matrix would be desirable. For example, one embodiment of the present invention is to use a translucent glass matrix in conjunction with an array of semispherical light emitting diodes to form a "light sheet", a large panel which will appear to uniformly glow over its entire surface when the light emitting diodes are activated. Such a translucent glass matrix is made by allowing air bubbles to remain trapped in the glass structure. In another embodiment of the invention, one or more semispherical light emitting diodes are used to uniformly light small bar of glass matrix surrounding the light emitting diodes. Such a bar could be used as a segment to form a display, in particular, one such use of a light bar would be in a "bar graph", or "thermometer" type of display. Since semispherical diodes can not be at present tested prior to assembly there is the possibility of a small number of semispherical light emitting diodes having intensity variation from point to point unless uniformity of materials and processes is carefully controlled. One solution to this problem is illustrated in FIG. 7. A large display 710 is comprised of seven segments. Each segment consists of many semispherical light emitting diodes, as exemplified by the enlarged segment 711, arrayed in a hexagonal closed packed configuration. Since there are a large number of spheres in each segment, variation in sphere to sphere light intensity will tend to be "averaged" by the eye of the observer. It is more practical to use a large number of small light sources in the present case then with planar devices. The reason is that in the present case the distribution of variable intensity will be essentially random, whereas a large number of sources in a conventional planar array would be expected to exhibit nonrandom variations over comparatively large areas, since the defective sources will likely be in close proximity to one another. Displays such as shown in FIG. 7 can be fabricated from single segments like 711 which are made as separate bars. Alternatively, an analog to a monolithic display could be made from a set of arrays 711 which are produced in a common substrate. If the lack of localization of the light emitting diode light makes it necessary, the glass matrix could be made opaque between segments by using, for example, a glass similar to Corning's "photoform" glass.

What is claimed is:

1. A light-emitting diode assembly comprising:
    substrate means;
    a radiant semiconductor diode embedded within said substrate means, said semiconductor diode including a semispherical semiconductor body of a first conductivity type and having a substantially planar circular surface and a spherical surface merging with said planar circular surface, the spherical surface of said semispherical semiconductor body being disposed within said substrate means in embedded relationship and the planar circular surface of said semispherical semiconductor body being disposed in substantially flush co-planar relation with a corresponding surface of said substrate means;
    a region of a second conductivity type opposite from the first conductivity type of said semispherical semiconductor body disposed in said semispherical semiconductor body and opening onto the planar circular surface thereof, said region and said semispherical semiconductor body defining a p-n junction therebetween;
    a first ohmic contact engaging said semispherical semiconductor body of the first conductivity type; and
    a second ohmic contact engaging said region of the second conductivity type.

2. A light-emitting diode assembly as set forth in claim 1 wherein said substrate means comprises a first insulation means.

3. A light-emitting diode assembly as set forth in claim 2 wherein said substrate means further includes a second insulation means for supporting said first insulation means.

4. A light-emitting diode assembly as set forth in claim 3, wherein said first insulation means comprises a glass matrix.

5. A light-emitting diode assembly as set forth in claim 4, wherein said second insulation means comprises a glass cast film.

6. A light-emitting diode assembly as set forth in claim 1 wherein the semiconductor material of said semispherical semiconductor body of the first conductivity type comprises a p-type compound semiconductor material, and said region of the second conductivity type comprises an n-type compound semiconductor material.

7. A light-emitting diode assembly as set forth in claim 1 wherein said first and second ohmic contacts comprise conductive metal members.

8. A light-emitting diode assembly as set forth in claim 1, wherein said first ohmic contact is an annular conductive member engaging the spherical surface of said semispherical semiconductor body and encircling said semispherical semiconductor body.

9. A light-emitting diode assembly as set forth in claim 8, further including an insulation layer disposed on said substrate means and the planar circular surface of said semispherical semiconductor body, said insulating layer having an aperture therethrough in alignment with said region of the second conductivity type; and
    said second ohmic contact in engagement with said region of the second conductivity type being received in the aperture of said insulating layer.

10. A light-emitting diode assembly as set forth in claim 9 wherein said insulation layer comprises a glass layer.

11. A light-emitting diode display comprising:
    substrate means;
    an array of a plurality of radiant semiconductor diodes embedded within said substrate means in spaced relation with respect to each other;
    each of said semiconductor diodes including a semispherical semiconductor body of a first conductivity type and having a substantially planar circular surface and a spherical surface merging with said planar circular surface, the spherical surface of said semispherical semiconductor body being disposed within said substrate means in embedded relationship and the planar circular surface of said semispherical semiconductor body being disposed in substantially flush co-planar relation with a corresponding surface of said substrate means, and
    a region of a second conductivity type opposite from the first conductivity type of said semispherical semiconductor body disposed in said semispherical semiconductor body and opening onto the planar circular surface thereof, said region and said semispherical semiconductor body defining a p-n junction therebetween;
    first ohmic contact means engaging each of said semispherical semiconductor bodies of the first conductivity type for the semiconductor diodes included in said array;
    second ohmic contact means engaging each of said regions of the second conductivity type of said semiconductor diodes included in said array; and
    an insulation layer disposed on said substrate means and covering the substantially planar circular surfaces of said semispherical semiconductor bodies of the plurality of semiconductor fiodes included in said array, said insulating layer being provided with aa plurality of apertures overlying said regions of the second conductivity type; and
    said second ohmic contact means in engagement with said regions of the second conductivity type being received in the apertures provided in said insulating layer.

12. A light-emitting diode display as set forth in claim 11, wherein said substrate means comprising a first insulation means.

13. A light-emitting diode display as set forth in claim 12 wherein said substrate means further includes second insulation means for supporting said first insulation means.

14. A light-emitting diode display as set forth in claim 11 wherein said substrate means includes a translucent glass matrix in conjunction with said array of said semiconductor diodes to form a light sheet for providing a light panel capable of having a glow over its entire surface in response to activation of said plurality of semiconductor diodes included in said array.

15. A light-emitting diode display as set forth in claim 11 wherein said array comprises groups of semiconductor diodes arranged in a seven-segment display.

16. A light-emitting diode display as set forth in claim 15 wherein each segment of said seven-segment display comprises a plurality of semiconductor diodes arranged in an array of hexagonal close packed configuration for averaging sphere-to-sphere light intensity.

17. A light-emitting diode display as set forth in claim 11, wherein the plurality of semiconductor diodes included in said array are arranged in rows and columns;

said first ohmic contact means including a first plurality of conductive strips arranged in one of the rows and columns of the array, each of the first conductive strips having a plurality of spaced circular openings therethrough;

said semispherical bodies of said semiconductor diodes being respectively received in the circular openings of said first conductive strips;

each of said first conductive strips engaging the spherical surfaces of a plurality of semispherical bodies of the semiconductor diodes included in a single one of the rows and columns of said array;

said second ohmic contact means including a second plurality of conductive strips arranged in the other of the rows and columns of the array; and each of said second conductive strips engaging the regions of the second conductivity type of a plurality of semispherical bodies of the semiconductor diodes included in a single one of the rows and columns of said array.

* * * * *